US012374391B2

(12) United States Patent
Lim et al.

(10) Patent No.: US 12,374,391 B2
(45) Date of Patent: *Jul. 29, 2025

(54) STATIC RANDOM ACCESS MEMORY WITH WRITE ASSIST ADJUSTMENT

(71) Applicant: Taiwan Semiconductor Manufacturing Co., Ltd., Hsinchu (TW)

(72) Inventors: Kian-Long Lim, East District (TW); Chia-Hao Pao, Kaohsiung (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/182,956

(22) Filed: Mar. 13, 2023

(65) Prior Publication Data
US 2023/0215496 A1 Jul. 6, 2023

Related U.S. Application Data

(63) Continuation of application No. 17/332,280, filed on May 27, 2021, now Pat. No. 11,605,423, which is a (Continued)

(51) Int. Cl.
*G11C 11/419* (2006.01)
*G11C 11/412* (2006.01)
*G11C 11/418* (2006.01)

(52) U.S. Cl.
CPC .......... *G11C 11/419* (2013.01); *G11C 11/412* (2013.01); *G11C 11/418* (2013.01)

(58) Field of Classification Search
CPC ... G11C 11/419; G11C 11/412; G11C 11/418; G11C 11/413; G11C 5/147; G11C 7/1096; G11C 11/41
See application file for complete search history.

(56) References Cited

U.S. PATENT DOCUMENTS 4,985,643 A * 1/1991 Proebsting ........... H03K 5/1534
326/97
9,741,429 B1 * 8/2017 Chen ..................... G11C 7/12
(Continued)

FOREIGN PATENT DOCUMENTS

CN 104637517 A 5/2015
CN 106328191 A 1/2017
(Continued)

*Primary Examiner* — Jay W. Radke
(74) *Attorney, Agent, or Firm* — Sterne, Kessler, Goldstein & Fox P.L.L.C.

(57) ABSTRACT

The present disclosure describes embodiments of a write assist circuit. The write assist circuit can include a boost circuit configured to output a first negative voltage at a first output terminal, and an adjustment circuit configured to couple the first negative voltage to a second negative voltage higher than the first negative voltage. The adjustment circuit can include a transistor, and a second output terminal electrically connected to the first output terminal. The transistor can include a first source/drain terminal, a second source/drain terminal, and a gate terminal. The first source/drain terminal can be electrically coupled to the second output terminal. The second source/drain terminal can be electrically connected to a voltage source. The gate terminal can be electrically connected to a ground voltage supply.

20 Claims, 10 Drawing Sheets

Related U.S. Application Data continuation of application No. 16/587,504, filed on Sep. 30, 2019, now Pat. No. 11,024,370.

(56) References Cited

U.S. PATENT DOCUMENTS

| | | |
|---|---|---|
| 11,024,370 B2 | 6/2021 | Lim et al. |
| 2002/0190752 A1 | 12/2002 | Takahashi et al. |
| 2015/0131364 A1 | 5/2015 | Hsieh et al. |
| 2019/0035455 A1 | 1/2019 | Fujiwara et al. |
| 2019/0074054 A1 | 3/2019 | Wang et al. |
| 2019/0180799 A1 | 6/2019 | Ahmed |
| 2019/0189197 A1 | 6/2019 | Nii et al. |

FOREIGN PATENT DOCUMENTS

| | | |
|---|---|---|
| CN | 109427394 A | 3/2019 |
| CN | 110021321 A | 7/2019 |
| JP | 2018125053 A | 8/2018 |

\* cited by examiner

STATIC RANDOM ACCESS MEMORY WITH WRITE ASSIST ADJUSTMENT

CROSS-REFERENCE TO RELATED APPLICATION

This application is a continuation application of U.S. patent application Ser. No. 17/332,280, filed on May 27, 2021, titled "Static Random Access Memory with Write Assist Adjustment," which is a continuation application of U.S. patent application Ser. No. 16/587,504, filed on Sep. 30, 2019, titled "Static Random Access Memory with Write Assist Adjustment," the disclosures of which are incorporated herein by reference in their entireties.

BACKGROUND

Static random access memory (SRAM) is a type of semiconductor memory used in computing applications that require, for example, high-speed data access. For example, cache memory applications use SRAMs to store frequently-accessed data—e.g., data accessed by a central processing unit.

The SRAM's cell structure and architecture enable high-speed data access. The SRAM cell includes a bi-stable flip-flop structure including, for example, four to six transistors. An SRAM architecture can include one or more arrays of memory cells and support circuitry. Each of the SRAM arrays is arranged in rows and columns corresponding to "wordlines" and "bitlines," respectively. The support circuitry includes address and driver circuits to access each of the SRAM cells—via the wordlines and bitlines—for various SRAM operations.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

DETAILED DESCRIPTION

Figure 1:
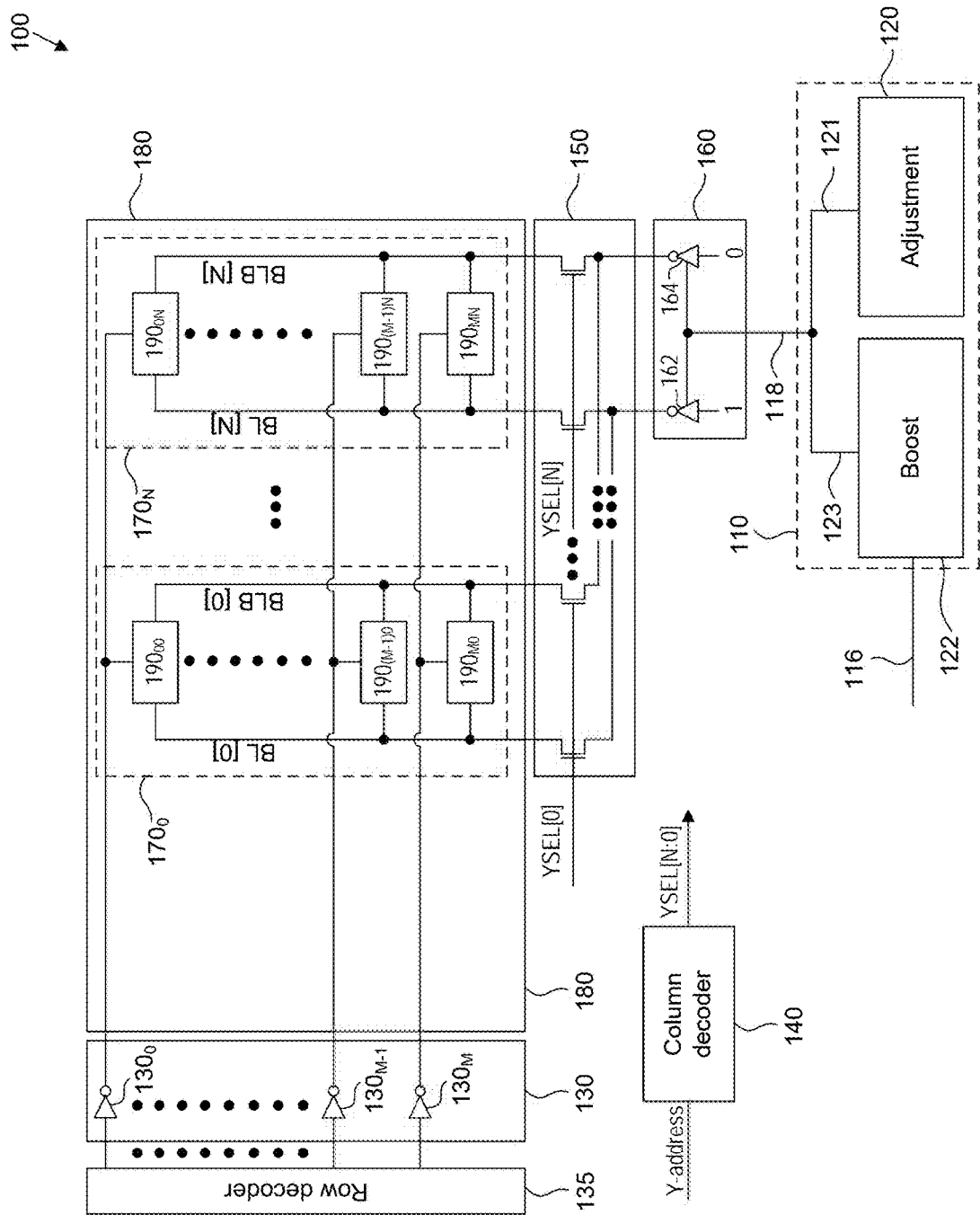
FIG. 1 illustrates a static random access memory with a write assist circuit, according to some embodiments.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

Spatially relative terms, such as "beneath," "underlying," "underneath," "below," "lower," "above," "upper," "lower," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., ±1%, ±2%, ±3%, ±4%, ±5% of the value).

As used herein, the term "logic low" refers to a voltage level corresponding a binary content of logic zero (e.g., bit '0') in the integrated circuit or a static random access memory (SRAM). In some embodiments, logic low can refer to a voltage level that is about a ground level (e.g., about 0 V), or a negative power supply voltage (e.g., −0.4 V, −0.6 V, −0.7 V, −1.0 V, −1.2 V, −1.8 V, −2.4 V, −3.3 V, −5 V, or any combination thereof).

As used herein, the term "logic high" refers to a voltage level corresponding a binary content of logic one (e.g., bit '1') in the integrated circuit or a static random access memory (SRAM). In some embodiments, logic high can refer to a voltage level that is about a positive power supply voltage (e.g., 0.4 V, 0.6 V, 0.7 V, 1.0 V, 1.2 V, 1.8 V, 2.4 V, 3.3 V, 5 V, or any combination thereof).

Static random access memory (SRAM) can be used in integrated circuits (IC) for high speed communication, imaging processing, and system-on-chip (SOC) applications. A SRAM can include multiple SRAM cells, where each SRAM cell can include a pair of cross-coupled inverters and pass gate transistors, through which binary content (e.g., a bit) can be read from or written to the SRAM cell. During a write operation for a selected SRAM cell, one of the selected SRAM cell's cross-coupled inverters' output node can be initially charged (e.g., to an ON state or a logic high value), while a corresponding pass gate transistor attempts to discharge the output node through a bitline or a complementary bitline. To strengthen the corresponding pass gate transistor (e.g., increase pass gate transistor's gate-to-source voltage ($V_{GS}$)), a negative voltage can be applied to the bitline or the complementary bitline to facilitate the discharging process (also referred to herein as a negative bitline (NBL) scheme). On the other hand, due to a temperature fluctuation or a fabrication process variation of the IC, a threshold voltage of the pass gate transistor in the SRAM cell can deviate from that of another pass gate transistor in other SRAM cells of the same IC. Such pass gate transistor's threshold voltage fluctuation can inadvertently cause the binary content to change for an unselected SRAM cell during the NBL scheme. This inadvertent change in binary content of an unselected SRAM cell is referred to herein as "a dummy write issue" and can result in a faulty operation of the IC.

The present disclosure is directed to a method and a circuit structure for adjusting a negative bitline voltage to avoid the dummy write issue. In some embodiments, a SRAM can include multiple SRAM cells and a write assist circuit configured to provide a reference voltage to the SRAM cells (e.g., a NBL scheme). In some embodiments, the write assist circuit can include a boost circuit configured to provide a first negative voltage (e.g., −200 mV) to the SRAM's bitlines and an adjustment circuit configured to couple the first negative voltage to the second negative voltage (e.g., −100 mV). The adjustment circuit can be configured to adjust the NBL scheme by increasing the bitline voltage from the first negative voltage (e.g., −200 mV) to a second negative voltage (e.g., −100 mV). The second negative voltage can be higher than the first negative voltage and can be provided to the SRAM bitlines as the reference voltage. In some embodiments, the adjustment circuit can include a bias compensation transistor, where a threshold voltage of the bias compensation transistor can be substantially equal to that of each pass gate transistor of the SRAM cells. In some embodiments, a gate of the bias compensation transistor can be electrically wired to a ground level (e.g. about 0 V), a source of the bias compensation transistor can be electrically wired to the ground level or a logic high voltage source, and a drain of the bias compensation transistor can be electrically coupled to the boost circuit and provide the second negative voltage. A benefit of the present disclosure is to effectively avoid the dummy write issue during a write operation by reducing a voltage difference between an unselected SRAM cell's pass gate transistor's gate and the bitline/complementary bitline, thus reducing a leakage current flowing through the pass gate transistor and preventing altering the binary content stored in the unselected SRAM cell.

The present disclosure describes aspects of a static random access memory (SRAM). Specifically, the disclosure describes different embodiments related to an SRAM memory write operation. For ease of explanation, certain SRAM circuit elements and control logic are disclosed to facilitate in the description of the different embodiments. The SRAM can include other circuit elements and control logic. These other circuit elements and control logic are within the spirit and scope of this disclosure.

FIG. 1 is an illustration of a static random access memory (SRAM) 100 with a write assist circuit 110 configured to provide a negative bit line (NBL) voltage (a.k.a. NBL scheme), according to some embodiments. SRAM 100 can include a row decoder 135, a wordline driver 130, a column decoder 140, a column multiplexer (MUX) 150, a write driver circuit 160, and an SRAM array 180. SRAM array 180 can include columns of SRAM cells $170_0$-$170_N$. In some embodiments, as illustrated in FIG. 1, write assist circuit 110, column MUX 150, and write driver circuit 160 can be proximately located near a lower portion of SRAM array 180. For example purpose, logic low and logic high associated with SRAM 100 will be respectively described in the context of a ground level (e.g., about 0 V) and a positive voltage level (e.g., about 0.5 V). Other voltage levels for logic low and logic high are within the scope of this disclosure.

Each of the SRAM cells in SRAM array 180 can be accessed—e.g., for memory read and memory write operations—using a memory address. Based on the memory address, row decoder 135 can select a row of memory cells to access via wordline driver 130. Also, based on the memory address, column decoder 140 can select a column of memory cells $170_0$-$170_N$ to access via write assist circuit 110 and column MUX 150, according to some embodiments. In some embodiments, write driver circuit 160 can generate voltages for bitline pairs BL/BLB in columns of memory cells $170_0$-$170_N$. The notation "BL" refers to a bitline, and the notation "BLB" refers to the complement of "BL" (also referred to herein as a complementary bitline). The intersection of the accessed row and the accessed column of memory cells can result in access to a single memory cell 190.

Each of columns of memory cells $170_0$-$170_N$ can include memory cells 190. Memory cells 190 can be arranged in one or more arrays in SRAM 100. In the present disclosure, a single SRAM array 180 is shown to simplify the description of the disclosed embodiments. SRAM array 180 has "M" number of rows and "N" number of columns. The notation "$190_{00}$" refers to memory cell 190 located in row '0', column $170_0$. Similarly, the notation "$190_{MN}$" refers to memory cell 190 located in row 'M', column $170_N$.

In some embodiments, as illustrated in FIG. 1, write driver circuit 160 can include level-shifter devices 162 and 164 that can each receive a reference voltage 118. Reference voltage 118 can be a ground level (e.g., 0 V), a negative voltage (e.g., −100 mV, −200 mV, or −300 mV), or a combination thereof, according to some embodiments. In some embodiments, with a logic low input received by either level-shifter device 162 or 164, the respective level-shifter device can output a logic high value. Conversely, with a logic high input received by either level-shifter device 162 or 164, the respective level-shifter device can output reference voltage 118.

In some embodiments, as illustrated in FIG. 1, write assist circuit 110 can be configured to provide reference voltage 118. Write assist circuit 110 can include a boost circuit 122 configured to provide a first voltage at an output terminal 123 and an adjustment circuit 120 configured to couple the first voltage to a second voltage, higher than or equal to the first voltage, at an output terminal 121. Both the first and the second voltages can be equal to or below logic low. In some embodiments, reference voltage 118 can be substantially equal to the first voltage at output terminal 123. In some embodiments, reference voltage 118 can be substantially equal to the second voltage at output terminal 121. In some embodiments, reference voltage 118 can be pulled up from the first voltage provided by boost circuit 122 to the second voltage provided by adjustment circuit 120. In some embodiments, reference voltage 118 can be between the first voltage provided by boost circuit 122 and the second voltage provided by adjustment circuit 120. In some embodiments, as illustrated in FIG. 1, output terminals 121 and 123 can be electrically wired to each other and provide reference voltage 118. In some embodiments, reference voltage 118 can be initialized to the ground level by boost circuit 122.

Boost circuit 122 can receive a negative bit line (NBL) enable signal 116 to determine the first voltage at output terminal 123. For example, in response to NBL enable signal 116 being at '1' or logic high, the first voltage provided by boost circuit 122 at output terminal 123 can be a negative voltage (e.g., −100 mV, −200 mV, or −300 mV) lower than the ground level. Adjustment circuit 120 can increase the first voltage from boost circuit 122 to provide the second voltage at output terminal 121 ranging from the first voltage to the ground level. For example, the first voltage provided by boost circuit 122 at output terminal 123 can be −200 mV, while adjustment circuit 120 can increase the first voltage, −200 mV, to provide the second voltage of −130 mV at output terminal 121. Accordingly, adjustment circuit 120 can be a compensation circuit to adjust reference voltage 118. In some embodiments, the second voltage at output terminal 121 can range from the first voltage to about logic low, such as from −200 mV to about 0 V. In some embodiments, in response to NBL enable signal 116 being at '0' or logic low, the first voltage at output terminal 123 can be about the ground level. In some embodiments, in response to the first voltage being about the ground level at output terminal 123, adjustment circuit 120 can provide the second voltage of about the ground level at output terminal 121; thus, reference voltage 118 can be at about the ground level.

Figure 2:
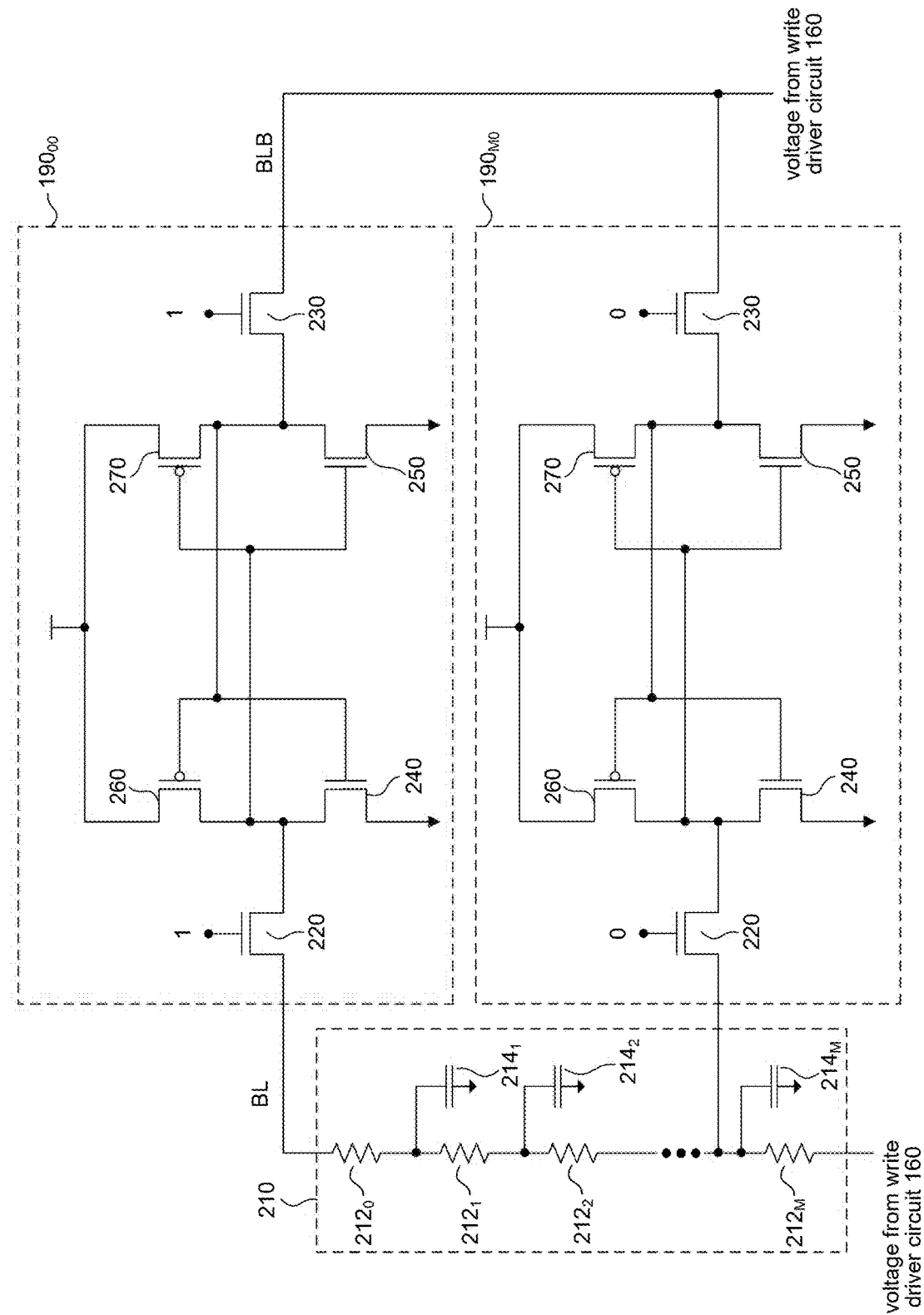
FIG. 2 illustrates an example static random access memory topology, according to some embodiments.

FIG. 2 illustrates two memory cells $190_{00}$ and $190_{M0}$ in column $170_0$ of SRAM 100, according to some embodiments. The discussion of elements with the same annotations in FIGS. 1 and 2 applies to each other, unless mentioned otherwise. As shown in FIG. 2, memory cell $190_{00}$ can represent an addressed (e.g., selected) SRAM cell, while memory cell $190_{M0}$ can represent an unselected SRAM cell. Memory cell 190 can have different circuit topologies. For example, each of memory cells $190_{00}$ and $190_{M0}$ can have a "6T" circuit topology. The 6T circuit topology can include n-channel metal-oxide-semiconductor (NMOS) pass gate transistors 220 and 230, NMOS pull-down transistors 240 and 250, and p-channel metal-oxide-semiconductor (PMOS) pull-up transistors 260 and 270. A voltage from wordline driver 130 can be coupled to gate terminals of each NMOS pass gate transistors 220 and 230. This can allow pass gate transistors 220 and 230 to pass voltages from the bitline pair BL/BLB to a bi-stable flip-flop structure formed by NMOS transistors 240 and 250 and PMOS transistors 260 and 270. The bitline pair BL/BLB voltages can be used during a memory write operation. For example, if BL is at '1' or logic high and BLB is at '0' or logic low, the voltage applied by wordline driver 130 to the gate terminals of NMOS pass transistors 220 and 230 can be at a sufficient voltage level to pass the BL's logic high value and the BLB's logic low value to the bi-stable flip-flop structure. As a result, these logic values are written (or programmed) into the bi-stable flip-flop structure.

In referring to FIG. 2, an example bitline parasitic model 210 is depicted for bitline BL for explanation purposes. The bitline BLB can have a similar bitline parasitic model. A network of resistor elements $212_0$-$212_M$ and capacitive elements $214_1$-$214_M$ (e.g., capacitors, capacitive circuits, or a combination thereof) can represent bitline parasitic model 210. Each resistor element 212 can represent a bitline BL path resistance between two SRAM cells along a column of memory cells. Each capacitive element 214 can represent a parasitic capacitance associated with a pass gate in each SRAM cell—e.g., parasitic capacitance associated with transistor 220 in memory cell 190—along the column of memory cells.

During the memory write operation, an addressed SRAM cell located a farther distance from a write driver circuit—e.g., memory cell $190_{00}$ in FIG. 2—can receive a bitline voltage different from its intended voltage level. This can be due to a voltage differential between the voltage at the output of the write driver circuit (e.g., write driver circuit 160 of FIG. 1) and the voltage at the bitline location associated with the addressed SRAM cell. This voltage differential can be attributed to the bitline path resistance between the write driver circuit and the addressed SRAM cell.

In referring to FIG. 2, resistor elements $212_0$-$212_M$ can model the bitline path resistance. If write driver circuit 160 outputs 0 V onto bitline BL, the voltage at an addressed memory cell 190—e.g., located a farther distance from the write driver circuit such as, for example, in the upper portion of SRAM array $190_{00}$ in FIG. 2—can be greater than 0 V due to the "IR" (current*resistance) voltage drop across resistor elements $212_0$-$212_M$. This voltage drop can result in an unintended rise in voltage at the bitline location associated with the addressed SRAM cell. This unintended rise in voltage—e.g., voltage greater than 0 V—can degrade the memory write operation of the SRAM cell because the SRAM cell's bi-stable flip-flop structure may not track its voltage level to the intended voltage—i.e., the write circuit output voltage. In other words, the unintended rise in voltage can prevent the SRAM cell from changing state. Advancing process technologies can further exacerbate the effects of this IR voltage drop because the bitline parasitic resistance can increase as advancing process technologies decrease the bitline's physical dimensions. In addition, density increases in SRAM arrays can also exacerbate the effects of the IR voltage drop because bitline length increases as SRAM arrays grow. As a result, it would be beneficial to have a write assist circuit (e.g., write assist circuit 110 shown in FIG. 1) to provide an intentional negative voltage at the bitline BL or complementary bitline BLB to compensate for the unintended rise in voltage (the NBL scheme).

On the other hand, a threshold voltage associated with each pass gate transistors 220 and 230 at each memory cell 190 can deviate from its designed value due to a fabrication process fluctuation or a high temperature of a working environment of SRAM 100. Based on the threshold voltage's target setting or working environment's temperature of SRAM 100, such undesired threshold voltage deviation can be out range of a design margin of the NBL scheme. For example, during a write operation using the NBL scheme, the negative voltage provided by boost circuit 122 (shown in FIG. 1) can be −200 mV or lower. If a threshold voltage fluctuation of gate terminals of NMOS pass transistors 220 and 230 is larger than about 130 mV, an unselected SRAM cell (e.g., SRAM cell $190_{M0}$ in FIG. 2) can be unexpectedly turned on to pass the BL and/or BLB's logic state to its bi-stable flip-flop structure, thus causing a write operation error (e.g., dummy write issue). In some embodiments, the threshold voltage fluctuation can range from about 130 mV to about 270 mV to cause the dummy write issue. Accordingly, it would be beneficial to have a write assist circuit (e.g., write assist circuit 110 shown in FIG. 1) to track and adjust the negative voltage range provided by the NBL scheme to compensate the dummy write issue.

Figure 3:
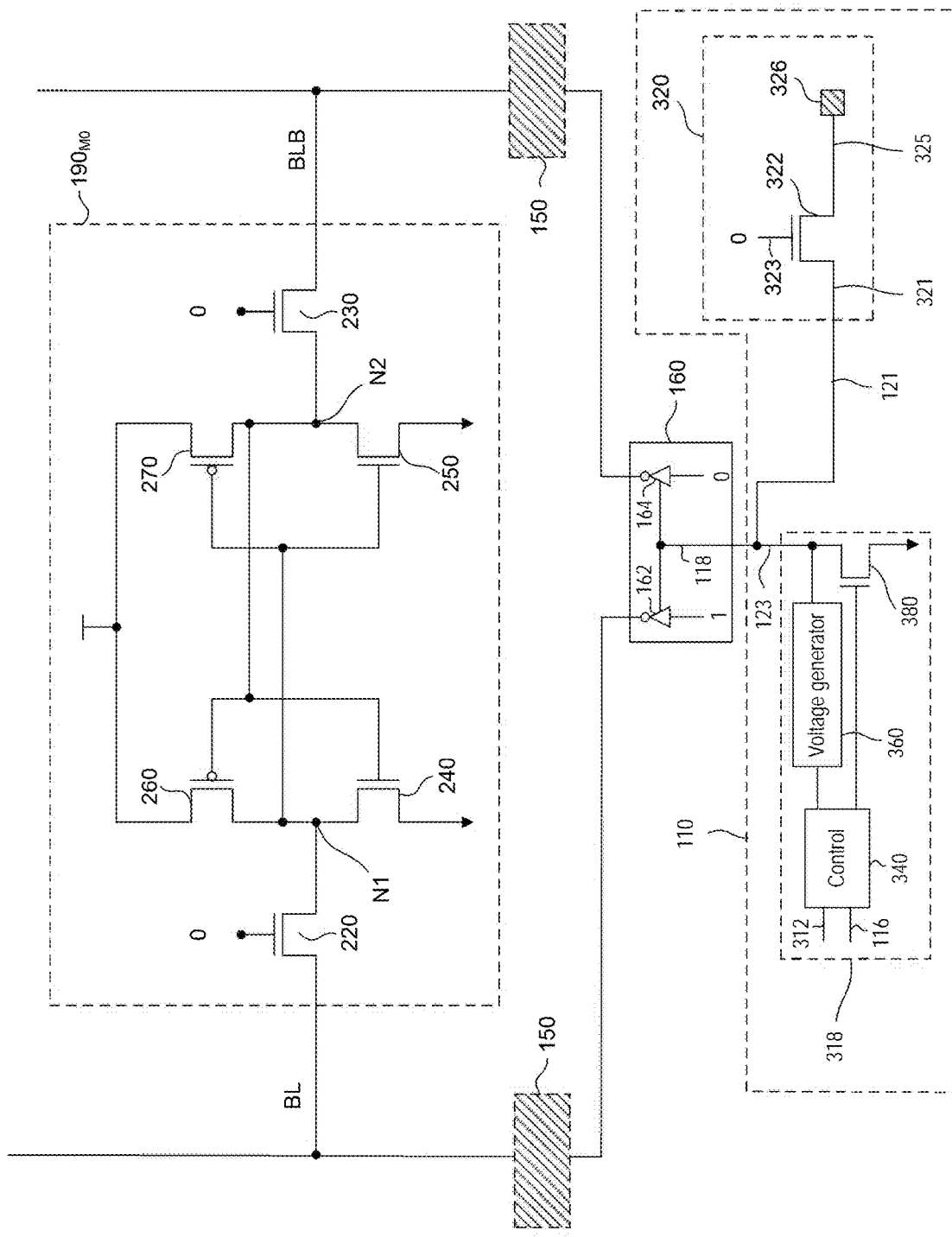
FIG. 3 illustrates a write assist circuit, a column multiplexer, and a write driver circuit for a static random access memory, according to some embodiments.

FIG. 3 illustrates write assist circuit 110, column MUX 150, write driver circuit 160, and unselected SRAM cell $190_{M0}$, according to some embodiments. The discussion of elements with the same annotations in FIGS. 1 and 3 applies to each other, unless mentioned otherwise. Write assist circuit 110 can include a boost circuit 318 and an adjustment circuit 320. The discussion of boost circuit 122 and adjustment circuit 120 can be respectively applied to boost circuit 318 and adjustment circuit 320, unless mentioned otherwise. Although FIG. 3 illustrates one SRAM cell $190_{M0}$ as an unselected SRAM cell, other SRAM cells, including addressed (selected) SRAM cells and/or unselected SRAM cells, in SRAM 100 can also be included in the scope and discussion of FIG. 3.

Boost circuit 318 can include a voltage generator 360, a pull-down transistor 380, and a control circuit 340 configured to control voltage generator 360 and pull-down transistor 380. During a memory write operation, based on a memory address signal 312 and NBL enable signal 116, control circuit 340 can couple a reference voltage—e.g., reference voltage 118 provided to write driver circuit 160—to a first negative voltage via voltage generator 360 and/or pull-down transistor 380. For example, memory address signal 312 can indicate a location of memory cell 190 in SRAM array 180 subject to a memory write operation, according to some embodiments. In response to NBL enable signal 116 being at '1' or logic high, control circuit 340 can trigger voltage generator 360 to provide the first voltage (e.g., a negative voltage, such as −100 mV, −200 mV, or −300 mV) at output terminal 123, based on memory address signal 312. As discussed previously for FIGS. 1 and 2, the first voltage provided by voltage generator 360 can be an embodiment of the NBL scheme to compensate for weaker NMOS pass gate transistors devices (e.g., NMOS pass gate transistor 220 and 230) in an SRAM cell (e.g., memory cell 190 of FIG. 2). In some embodiments, in response to NBL enable signal 116 being at '0' or logic low, control circuit 340 can deactivate voltage generator 360 and activate pull-down transistor 380 to provide the ground level at output terminal 123 (e.g., reference voltage 118 can be about 0 V).

Adjustment circuit 320 can include a pass gate transistor 322 configured to compensate (e.g., pull up) the negative voltage provided by boost circuit 318 and a voltage element 326 connecting to pass gate transistor 322. Pass gate transistor 322 can have a threshold voltage substantially equal to that of pass gate transistors 220/230 in any of memory cells 190 and can have terminals 321, 323, and 325. Pass gate transistor 322's terminal 323 can be pass gate transistor 322's gate terminal and can be electrically connected to and wired to a ground level or logic low. Pass gate transistor 322's terminals 321 and 325 can interchangeably be pass gate transistor 322's drain and source terminals. As shown in FIG. 3, pass gate transistor 322's terminal 321 (e.g., drain terminal) can be electrically coupled to adjustment circuit 320's output terminal 121, while pass gate transistor 322's terminal 325 (e.g., source terminal) can be electrically connected to and wired to voltage element 326. Voltage element 326 can be a ground in SRAM 100. In some embodiments, voltage element 326 can be a power supply voltage source providing the logic low level, the logic high level, or a voltage level between the logic low and the logic high levels.

Pass gate transistor 322 can have similar voltage-passing capability as any pass gate transistor of any unselected memory cell 190, where the voltage-passing capability can be represented by the difference between the transistor's gate-to-source voltage and threshold voltage ($V_{GS}$-$V_t$). For example, in referring to FIG. 3, pass gate transistor 322 can have substantially same ($V_{GS}$-$V_t$) as pass gate transistor 220 of unselected memory cell $190_{M0}$. It is because both pass gate transistor 322 and unselected memory cell $190_{M0}$'s pass gate transistor 220 can have similar threshold voltages, substantially the same bias (e.g., ground level) at their gate terminals, and substantially the same bias at their drain terminals (e.g., reference voltage 118 can be passed from terminal 121 to BL by level-shifter device 162). Therefore, both pass gate transistor 322 and unselected memory cell $190_{M0}$'s pass gate transistor 220 can isolate or pass voltages between their source and drain terminals. For example, as shown in FIG. 3, in response to reference voltage 118 being at a negative voltage level (e.g., lower than −200 mV), a ($V_{GS}$-$V_t$) associated with unselected memory cell $190_{M0}$'s pass gate transistor 220 can be partially activated to form an undesirable electrical conduction between BL and node N1. Nevertheless, the substantially equal ($V_{GS}$-$V_t$) values can be associated with pass gate transistor 322 to form substantially the same electrical conduction between terminals 321 and 325. Since voltage element 326 can at least provide a voltage level equal to or higher than the ground level, reference voltage 118 can therefore be positively pulled up by voltage element 326, thus having a less negative value (e.g., reference voltage 118 can be pulled up from −200 mV to −100 mV). This can accordingly reduce ($V_{GS}$-$V_t$) of both pass gate transistor 322 and unselected memory cell $190_{M0}$'s pass gate transistor 220, thus ensuring unselected memory cell $190_{M0}$'s pass gate transistor 220 is turned off, thus preserving the binary content stored at node N1.

Figure 4:
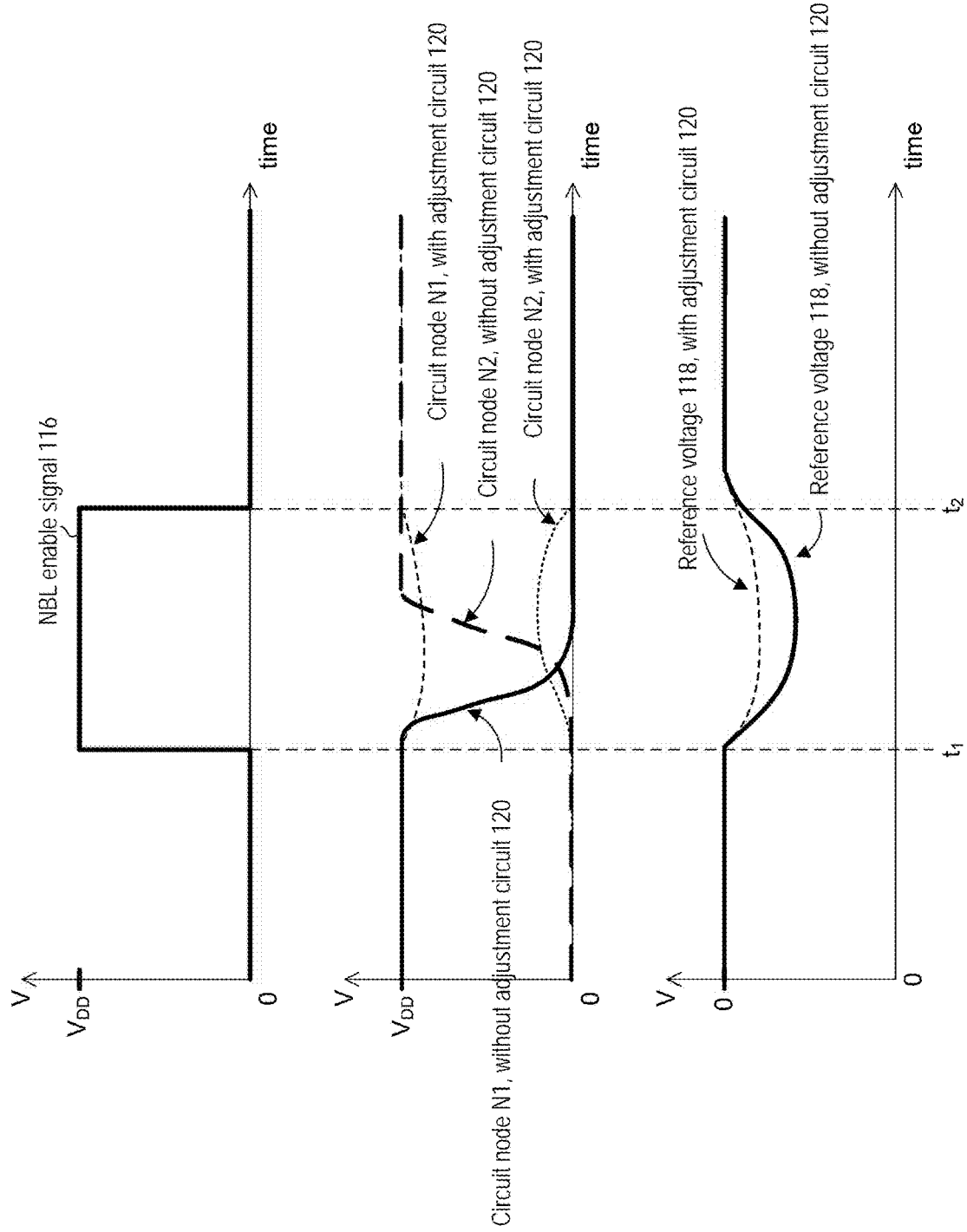
FIG. 4 illustrates example signal waveforms for a write assist circuit, according to some embodiments.

FIG. 4 is an illustration of example signal waveforms for write assist circuit 110 during a write operation using the NBL scheme, according to some embodiments. By way of example and not limitation, FIG. 4 shows signal waveforms for NBL enable signal 116, circuit nodes N1 and N2 (both shown in FIG. 3) of an unselected memory cell 190 (e.g., unselected memory cell $190_{M0}$ shown in FIG. 3), and reference voltage 118 at terminals 121 and 123. During the memory write operation, these example waveforms assume that '1' or logic high is associated with a positive voltage VDD, and '0' or logic low is associated with the ground level (e.g., about 0 V).

From time=0 to time $t_1$, NBL enable signal 116 is set at logic low '0', while circuit nodes N1 and N2 can be respectively at logic high and logic low. Also, with NBL enable signal 116 at logic low, reference voltage 118 provided by write assist circuit 110 can be at the ground level.

At time $t_1$, NBL enable signal 116 transitions from logic low to logic high, thus activating write assist circuit 110 to set reference voltage 118 to a negative value (e.g., −100 mV, −200 mV, or −300 mV). Such negative reference voltage 118 can be transferred to BL (shown in FIG. 3) and coupled to the unselected memory cell 190.

In some embodiments, write assist circuit 110 does not include adjustment circuit 120, in which reference voltage 118 is set by boost circuit 122 (shown in FIG. 1). In response to reference voltage 118 being negative (e.g., lower than −200 mV), the unselected memory cell 190's pass gate transistor 220 (shown in FIG. 3) can be partially turned on to form an electrical conduction path between its drain terminal and source terminal. This can facilitate the discharge process to change node N1's binary content from '1' to '0', before the end of the write operation (e.g., before time $t_2$). With node N1's binary content being erroneously changed, node N2 is also respectively and incorrectly changed from '0' to '1'.

In some embodiments, write assist circuit 110 can include adjustment circuit 120, in which reference voltage 118 can be determined by both boost circuit 122 and adjustment circuit 120 (both shown in FIG. 1). As previously discussed in FIGS. 1 and 3 (e.g., adjustment circuit 320, an embodiment of adjustment circuit 120), adjustment circuit 120 can compensate and adjust (e.g., pull up) the negative voltage provided by boost circuit 122. This can set reference voltage 118 to be a less negative value (e.g., −100 mV). As a result, the gate-to-source voltage ($V_{GS}$) of unselected memory cell 190's pass gate transistor 220 can be reduced to mitigate the electrical conduction between its drain terminal and source terminal. This can limit the discharge/charging process that affects the stored binary contents in nodes N1 and N2, thus avoid a write error (dummy write issue) on unselected memory cell 190.

At time $t_2$, NBL enable signal 116 transitions from logic high to logic low. This can deactivate write assist circuit 110 to set reference voltage 118 to the ground level. In response, unselected memory cell 190 is not subject to the dummy write issue; that is, the binary content stored in unselected memory cell 190 after time $t_2$ can be the same as that before time $t_1$.

Figure 5:
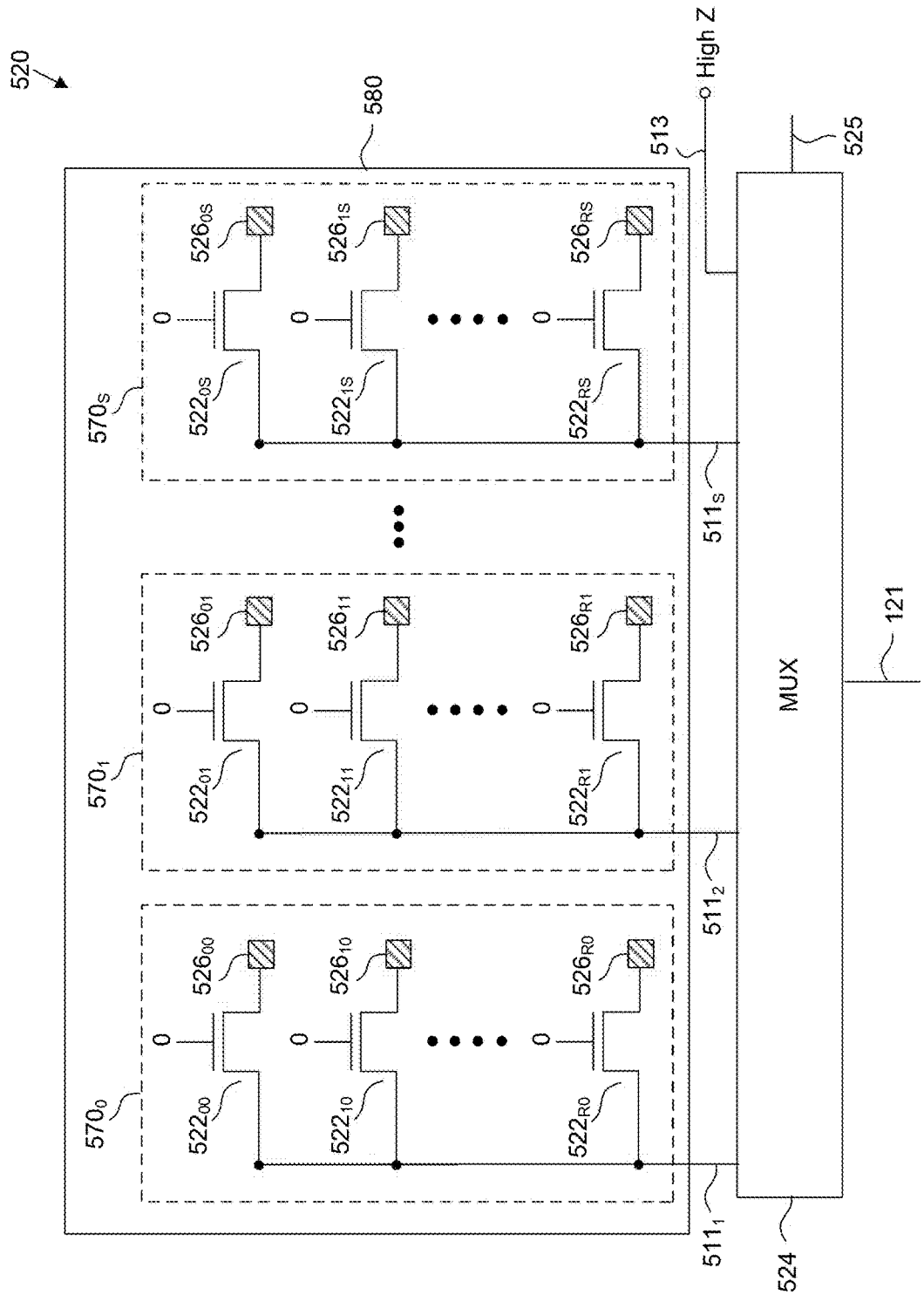
FIG. 5 illustrates an adjustment module for a write assist circuit, according to some embodiments.

FIG. 5 illustrates an adjustment circuit 520, according to some embodiments. The discussion of elements with the same annotations in FIGS. 1-3 and 5 applies to each other, unless mentioned otherwise. The discussion of adjustment circuits 120 and 320 can be both applied to adjustment circuit 520, unless mentioned otherwise. Adjustment circuit 520 can include a transistor bank 580 and a MUX 524 connected to transistor bank 580. Transistor bank 580 can include multiple transistor columns $570_0$-$570_S$, where "S" represents the number of transistor columns in transistor bank 580. In some embodiments, the number S can be 1, 2, 4, or any other number. Each of transistor columns $570_0$-$570_S$ can include multiple of transistors 522 and voltage elements 526 connected to respective transistors 522. The discussion of transistor 322 and voltage element 326 can be respectively applied to transistor 522 and voltage element 526, unless mentioned otherwise. The notation "$522_{RS}$" refers to transistor 522 located in row 'R', column $570_S$. Similarly, the notation "$526_{RS}$" refers to voltage element 526 located in row 'R', column $570_S$. In some embodiments, each of transistor columns $570_0$-$570_S$ can have different number (R) of transistors 522/voltage elements 526 from each other. In some embodiments, the number R can be 64, 128, 256, or any other number.

Transistors 522 in each transistor column $570_0$-$570_S$ can have a threshold voltage substantially equal to each other, while transistors 522 between each transistor columns $570_0$-$570_S$ can have a different threshold voltage from each other. For example, each transistor $522_{00}$-$522_{R0}$ in transistor column $570_0$ can have a threshold voltage of about 0.3 V, while each transistor $522_{01}$-$522_{R1}$ in transistor column $570_1$ can have a threshold voltage of about 0.5 V. At least one of the threshold voltages associated with transistor columns $570_0$-$570_S$ can be substantially equal to those of one or more pass gate transistors 220 and 230 in memory cells 190.

As shown in FIG. 5, each transistor 522 in each transistor column $570_0$-$570_S$ can have its gate terminal electrically connected to the ground level or logic low. Each transistor 522 in each transistor columns $570_0$-$570_S$ can have its source/drain terminals interchangeably connected to voltage elements 526 and one of MUX 524's input terminals $511_1$-$511_S$. Each transistor column $570_0$-$570_S$ can be regarded as multiple adjustment circuits 320 connected in parallel. Such parallel connection can enhance a driving capacity to charge/discharge BL/BLB when compensating the negative voltage provided by boost circuit 120 (shown in FIGS. 1 and 3). MUX 524 can select one of the transistor columns $570_0$-$570_S$ based on a selection signal 525 and connect the respective transistors 522's source or drain terminal to adjustment circuit 520's output terminal 121.

In some embodiments, MUX 524 can further include an input terminal 513 that connects a high impedance (e.g., open circuit) to terminal 513 based on selection signal 525. In response to the high impedance at input terminal 513 selected by MUX 524, adjustment circuit 520 can be deactivated to stop compensating the negative voltage provided by boost circuit 120. As a result, the NBL voltage provided by write assist circuit 110 is provided by boost circuit 120.

Figure 6:
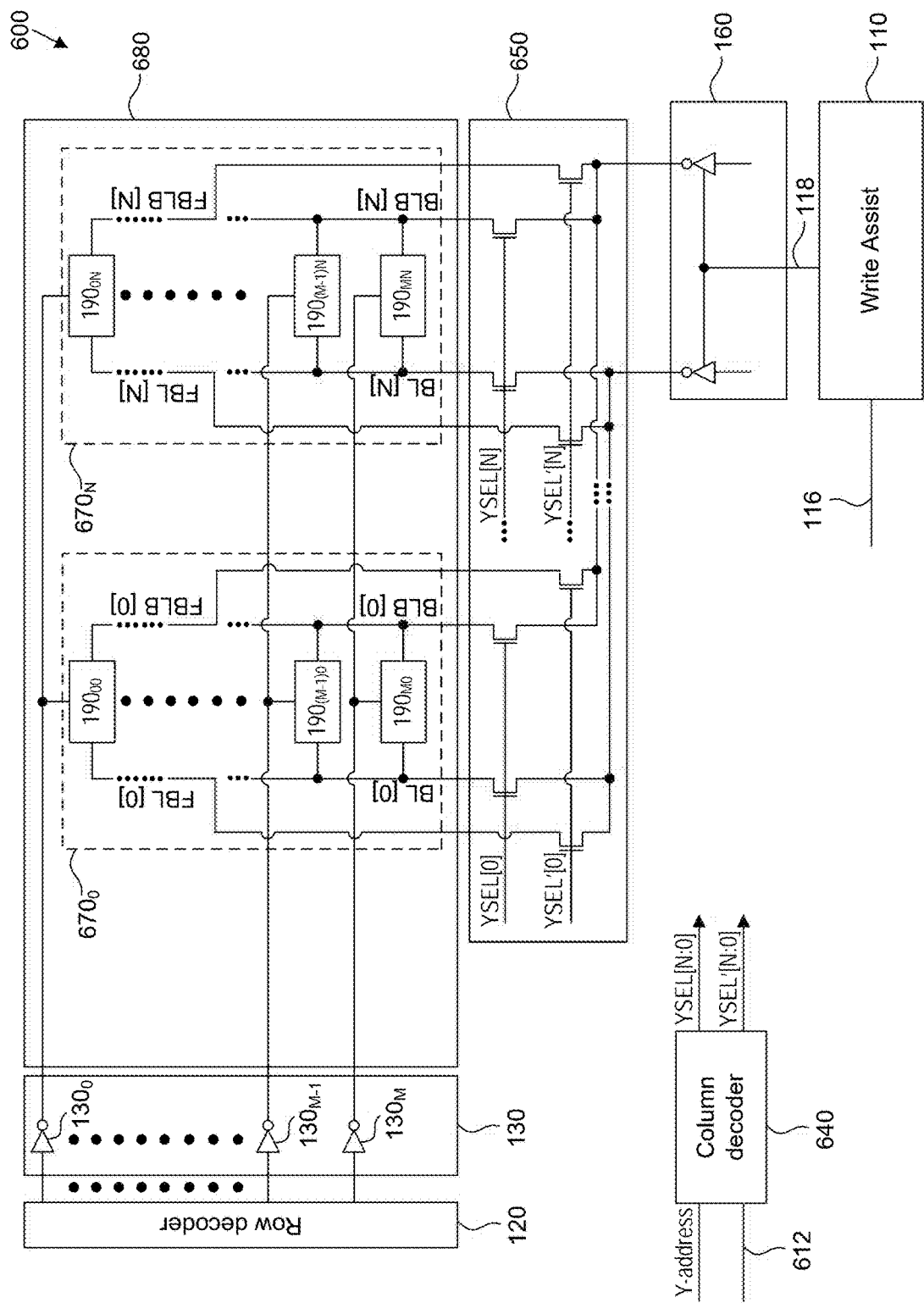
FIG. 6 illustrates a static random access memory with an auxiliary bitline topology, according to some embodiments.

FIG. 6 illustrates an SRAM 600 with an auxiliary bitline topology, according to some embodiments. The discussion of elements with the same annotations in FIGS. 1 and 6 applies to each other, unless mentioned otherwise. The discussion of SRAM 100 can be applied to SRAM 600, unless mentioned otherwise. SRAM 600 can include row decoder 135, wordline driver 130, a column decoder 640, a column multiplexer (MUX) 650, write driver circuit 160, write assist circuit 110, and an SRAM array 680. In some embodiments, as illustrated in FIG. 6, write assist circuit 110, column MUX 650, and write driver circuit 160 can be proximately located near a lower portion of SRAM array 680.

SRAM array 680 can include columns of memory cells $670_0$-$670_N$. Each of columns $670_0$-$670_N$ can include memory cells 190. In some embodiments, each of the columns $670_0$-$670_N$ can also include a bitline pair BL/BLB (also referred to herein as "a first set of bitlines") and an auxiliary bitline pair FBL/FBLB (also referred to herein as "a second set of bitlines"). The bitline pair BL/BLB can be used to access memory cells 190 in a lower portion of SRAM array 680 and the auxiliary bitline pair FBL/FBLB can be used to access memory cells 190 in an upper portion of SRAM array 680. For example, for SRAM array 680 with 1024 rows, in each of columns $670_0$-$670_N$, the bitline pair BL/BLB can be coupled to NMOS pass gate transistors (e.g., NMOS pass gate transistors 220 and 230) of memory cells 190 for rows '0' to '511'. The auxiliary bitline pair FBL/FBLB can be coupled to NMOS pass gate transistors of memory cells 190 for rows '512' to '1024'. By implementing an alternative bitline path via the auxiliary bitline pair FBL/FBLB to memory cells 190 in the upper portion of SRAM array 680, an overall parasitic resistance and capacitance associated with non-accessed memory cells 190 can be decreased, thus decreasing an IR voltage drop and RC time delay to an accessed memory cell 190 in the upper portion of SRAM array 680.

Column decoder 640 can be used to select either the bitline pair BL/BLB or the auxiliary bitline pair FBL/FBLB based on a location of memory cell 190 in SRAM array 680 subject to a memory write operation, according to some embodiments. In some embodiments, column decoder 640 can receive an auxiliary bitline (FBL) enable signal 612, which can indicate whether memory cell 190 is in an upper portion of SRAM array 680 (e.g., a memory cell in rows '512' to '1024'). In some embodiments, if FBL enable signal 612 is '1' or logic high, a corresponding YSEL'[N:0] signal can be selected to activate a corresponding y-select transistor in column MUX 650 to access a corresponding auxiliary bitline pair FBL/FBLB. Conversely, if FBL enable signal 612 is '0' or logic low, a corresponding YSEL[N:0] signal can be selected to activate a corresponding y-select transistor in column MUX 650 to access a corresponding bitline pair BL/BLB.

In SRAM 600, write assist circuit 110 can compensate the IR voltage drop in the bitlines. For addressed SRAM cells—especially those cells located farther from the write driver circuit (e.g., memory cell $190_{0N}$ in FIG. 6)— write assist circuit 110 can "pull" the voltage level at the bitline location associated with the addressed SRAM cell closer to an intended voltage level. For example, if a 200 mV bitline IR drop exists between the output of write driver circuit 160 and an addressed SRAM cell, the reference voltage output from write driver circuit 160 can be adjusted, for example, to: (i) −300 mV so the bitline voltage at the addressed SRAM cell can be near or at −100 mV; (ii) −400 mV so the bitline voltage at the addressed SRAM cell can be near or at −200 mV; (iii) −500 mV so the bitline voltage at the addressed SRAM cell can be near or at −300 mV; (iv) or any other negative voltage for a desired voltage level at the addressed SRAM cell.

In addition to compensating for the IR voltage drop in the bitlines, write assist circuit 110 can provide negative voltage tuning for different portions of the SRAM array, thus reducing power consumption. For example, for SRAM cells in a lower portion of the SRAM array (e.g., memory cells 190 in rows '0' through '511' of SRAM array 180 in FIG. 1), write assist circuit 110 can provide a higher negative voltage (e.g., −100 mV) to SRAM cells in this portion as compared to a lower negative voltage (e.g., −200 mV) provided to SRAM cells in an upper portion of the SRAM array (e.g., memory cells 190 in rows '512' through '1024' of SRAM array 180). With the higher negative voltage (i.e., a lower voltage magnitude) provided to the memory cells in the lower portion of the SRAM array, less power is consumed by, for example, write driver circuit 160. In some embodiments, the SRAM array can be partitioned into more than two portions, in which each of the more than two portions can receive a different negative voltage based on a row location of a memory cell subject to the memory write operation. With this further tuning of negative voltages based on memory row location, power consumption can be further optimized.

Further, write assist circuit 110 can also compensate for process variations in the SRAM cell transistors. For example, in referring to memory cell 190$_{00}$ in FIG. 2, process variations can cause PMOS pull-up transistors 260 and 270 to be stronger than NMOS pass transistors 220 and 230. This process variation can cause issues during a memory write operation. Because the PMOS pull-up transistors can impede the NMOS pass transistors' ability to pull an internal node—e.g., any internal nodes between the PMOS pull-up transistor and the NMOS pull-down transistor—from a power supply voltage VDD (e.g., 0.4 V, 0.6 V, 0.7 V, 1.0 V, 1.2 V, 1.8 V, 2.4 V, 3.3 V, 5 V, or any combination thereof) to ground (e.g., 0 V). To compensate for the weaker NMOS pass transistor, write assist circuit 110 can provide a negative voltage for write driver circuit 160 to promote pulling the internal nodes to ground.

Figure 7A:
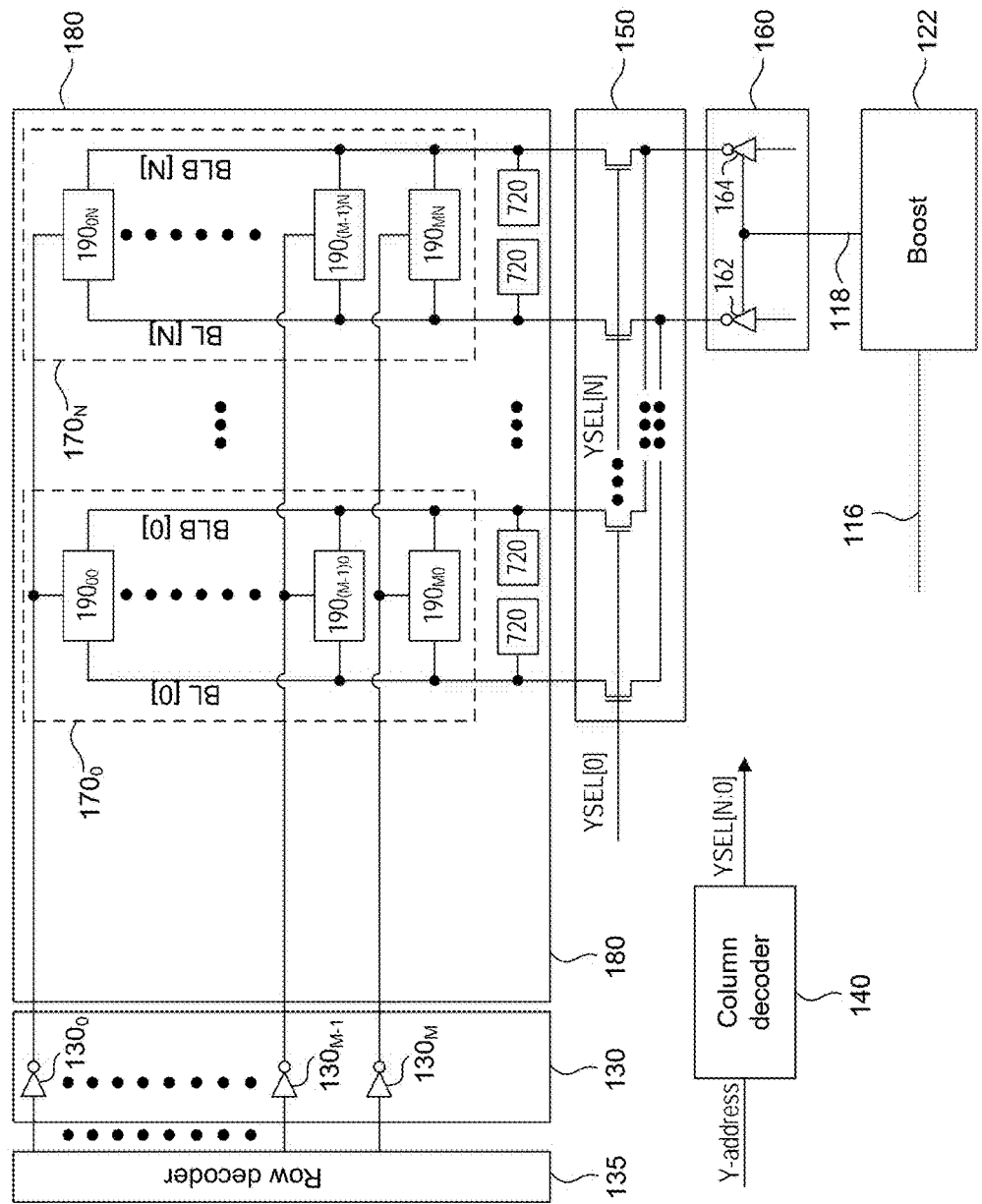
FIG. 7A illustrates a static random access memory with an adjustment circuit, according to some embodiments.

FIG. 7A illustrates an SRAM 700 with adjustment circuits 720, according to some embodiments. The discussion of SRAM 100 can be applied to SRAM 700, unless mentioned otherwise. The discussion of adjustment circuit 520 can be applied to adjustment circuit 720, unless mentioned otherwise. Further, the discussion of elements with the same annotations in FIGS. 1, 2, 5, and 7A applies to each other, unless mentioned otherwise.

SRAM 700 can include SRAM array 180, row decoder 135, wordline driver 130, column decoder 140, MUX 150, write driver circuit 160, boost circuit 120, and multiple pairs of adjustment circuits 720. Boost circuit 122 can be configured to provide reference voltage 118 to write driver circuit 160 to generate bit voltages at BL/BLB. As shown in FIG. 7A, each columns of SRAM cells 170$_0$-170$_N$ can include one adjustment circuit 720 connecting to BL and another adjustment circuit 720 connecting to BLB. Therefore, the pair of adjustment circuits 720 can be configured to respectively compensate (e.g., pull up) the bit line voltages at BL and BLB to avoid the previously discussed dummy write issue. In some embodiments, each columns of SRAM cells 170$_0$-170$_N$ can include multiple pairs of adjustment circuits 720, where each pair of adjustment circuits 720 can be located at different portion of the each column of SRAM cells. For example, for SRAM array 180 with 1024 rows, in each of columns 170$_0$-170$_N$, a first pair of adjustment circuits 720 can be placed adjacent to row 511, and a second pair of adjustment circuits 720 can be placed adjacent to row 1023. The first and second pairs of adjustment circuits 720 can be configured to respectively prevent the dummy write issue for SRAM cells 190 at rows '0' to '511' and rows '512' to '1024.

Figure 7B:
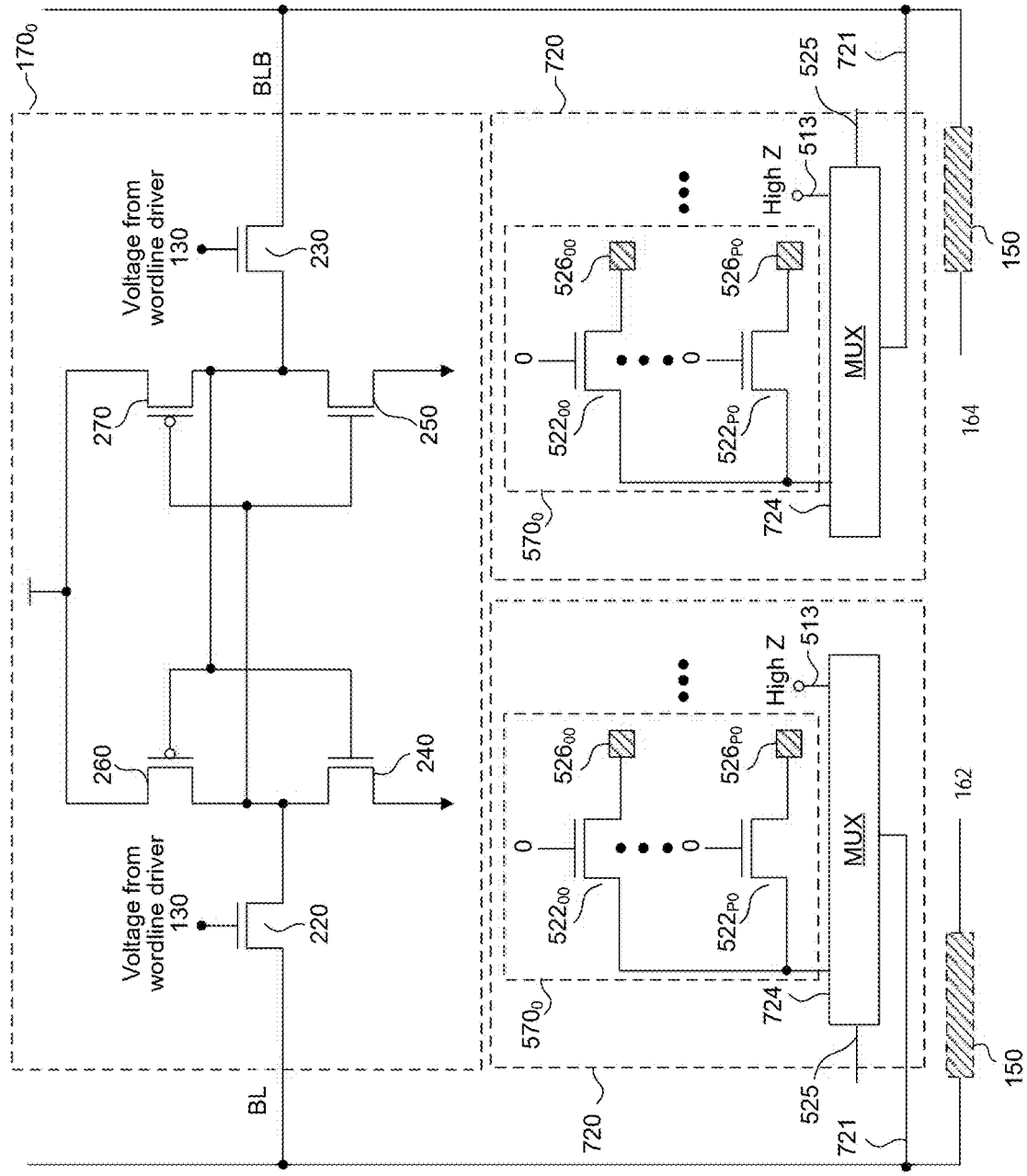
FIG. 7B illustrates an adjustment circuit, a column multiplexer, and a static random access memory cell, according to some embodiments.

FIG. 7B illustrates a pair of adjustment circuits 720 connected to BL/BLB associated with column of SRAM cells 170$_0$, according to some embodiments. The discussion of elements with the same annotations in FIGS. 1, 2, 5, and 7B applies to each other, unless mentioned otherwise. Adjustment circuit 720 can include one or more transistor columns 570$_0$-570$_S$ (FIG. 7B only illustrates one transistor column 570$_0$) and a MUX 724 connecting to transistor columns 570$_0$-570$_S$. The discussion of MUX 524 can be applied to MUX 724, unless mentioned otherwise. MUX 724 can select one of the transistor columns 570$_0$-570$_S$ based on selection signal 525 and connect the respective transistors 522's source or drain terminal to adjustment circuit 720's output terminal 721. As shown in FIG. 7B, one of adjustment circuit 720's MUX 724 can connect its output terminal 721 to BL, while the other adjustment circuit 720's MUX 724 can connect its output terminal 721 to BLB. As a result, the pair of adjustment circuits 720 shown in FIG. 7B can be configured to avoid the dummy write issue for column of SRAM cells 170$_0$.

Figure 8:
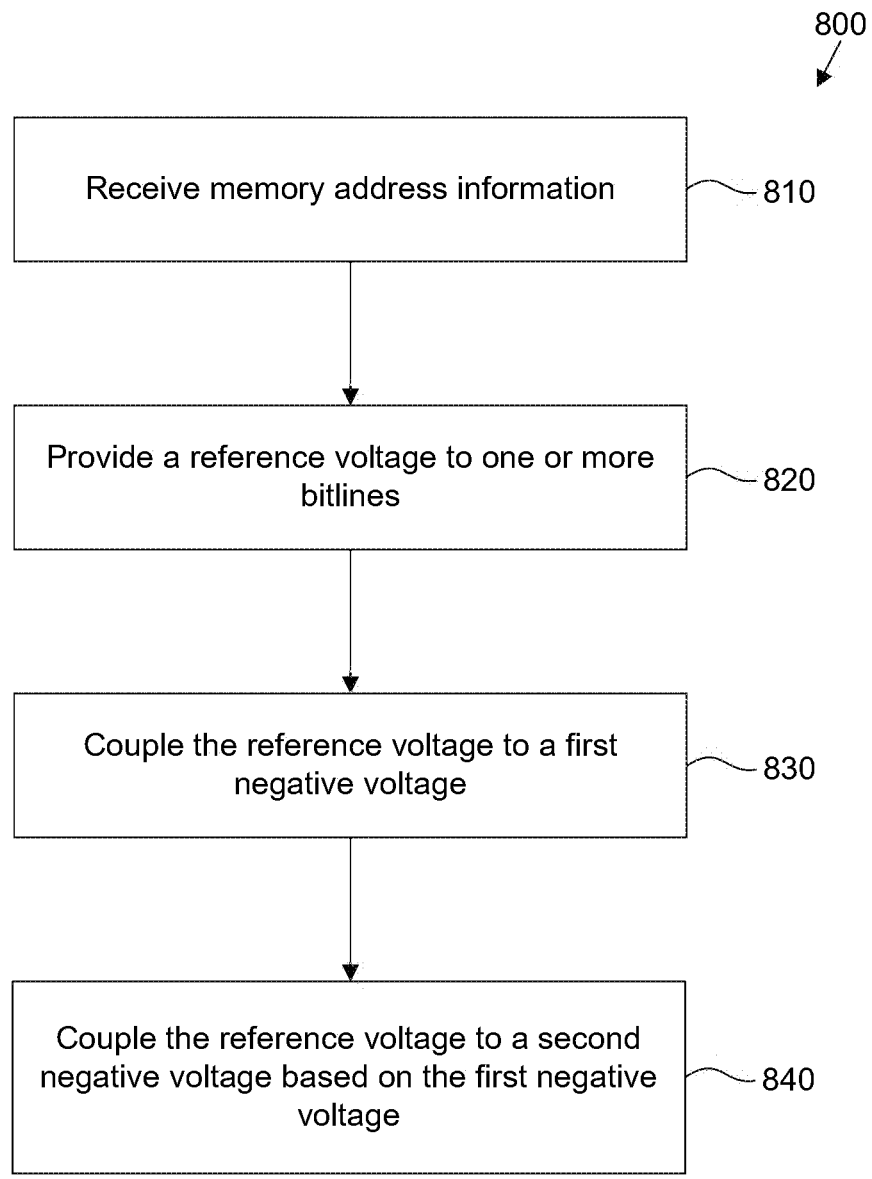
FIG. 8 illustrates a method for a memory write operation, according to some embodiments.

FIG. 8 illustrates a method 800 for a memory write operation performed on SRAM 100, according to some embodiments. The operations shown in method 800 can be performed by, for example, write assist circuit 110 of FIGS. 1 and 3. Other operations in method 800 can be performed. Further, the operations of method 800 can be performed in a different order and/or vary.

At operation 810, memory address information associated with the memory write operation for one or more memory cells is received. In some embodiments, the memory address information can include row location of an SRAM cell subject to the memory write operation. In referring to FIG. 1, column decoder 140 can receive the memory address information.

At operation 820, a reference voltage is provided to one or more bitlines coupled to the one or more memory cells. In some embodiments, the reference voltage can be provided by pull-down transistor 380 of FIG. 3 that can initialize the reference voltage to the ground level prior to coupling the reference voltage to a negative voltage (as discussed below in operations 830 and 840).

At operation 830, the reference voltage is coupled to a first negative voltage with a boost circuit, based on the memory address information. For example, in referring to FIGS. 3 and 4, when NBL enable signal 116 transitions from '0' to '1' (e.g., from logic low to logic high), reference voltage 118 can be coupled to the first negative voltage (e.g., reference voltage 118 without adjustment circuit 120, shown in FIG. 4). In some embodiments, reference voltage 118 can be coupled to the first negative voltage after pull-down transistor 380 is deactivated.

At operation 840, the reference voltage is coupled, with an adjustment circuit, to a second negative voltage higher than the first negative voltage. For example, in referring to FIG. 3, reference voltage 118 can be pulled up, with adjustment circuit 320, from the first negative voltage to the second negative voltage by grounding transistor 322's gate terminal, biasing transistor 322's source terminal with the ground level or a positive voltage supply, and pulling up the first negative voltage by transistor 322's drain terminal to form the second negative voltage to provide the reference voltage. In some embodiments, reference voltage 118 can be pulled up by the second negative voltage based on selection signal 525 that selects transistor columns 570$_0$-570$_S$ of adjustment circuit 520 that can receive the first negative voltage and can adjust the first negative voltage to the second negative voltage. In some embodiments, the reference voltage can be substantially equal to the second negative voltage. In some embodiments, the reference voltage can be between the first negative voltage and the second negative voltage. In some embodiments, the reference voltage can be determined based on the memory address information. In some embodiments, operations 830 and 840 can be performed concurrently.

Figure 9:
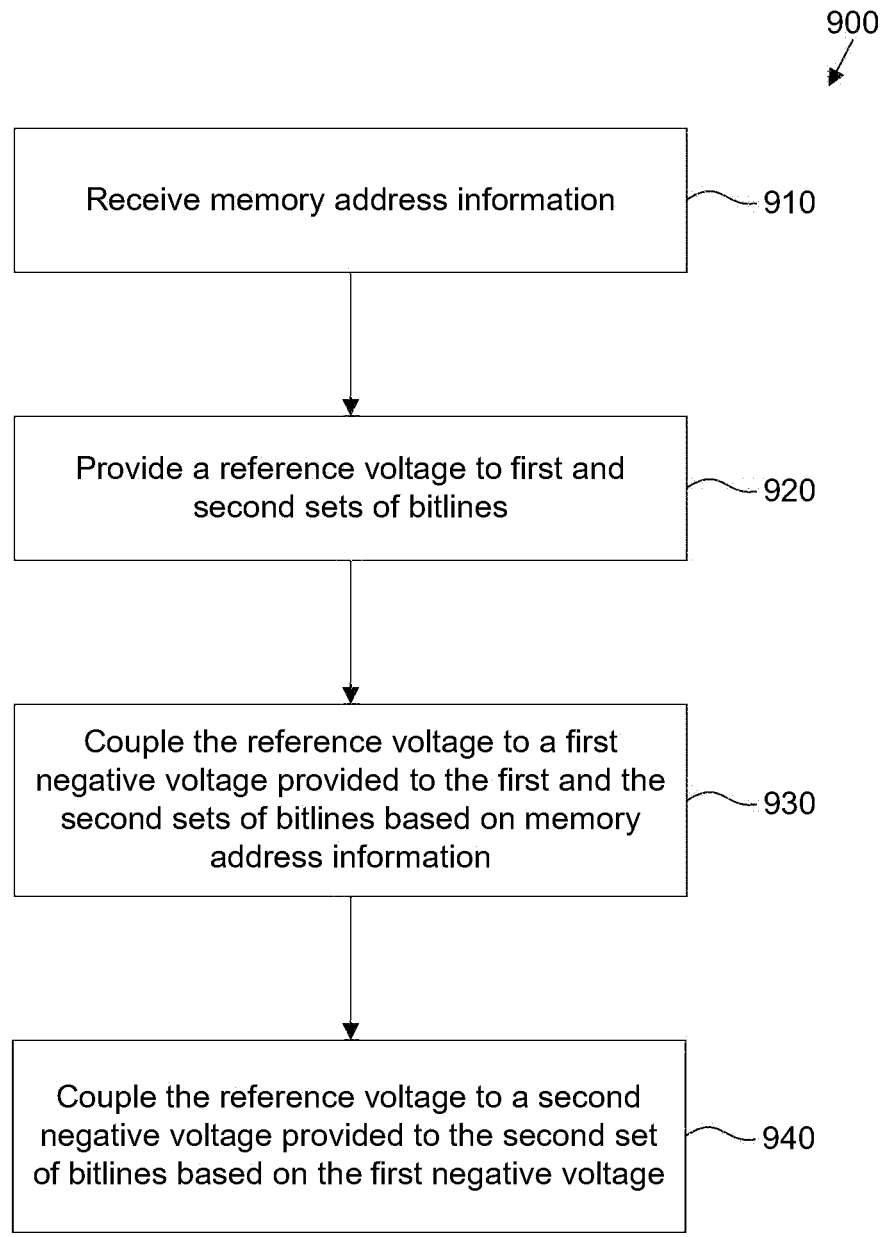
FIG. 9 illustrates a method for a memory write operation performed by a static random access memory with an auxiliary bitline topology, according to some embodiments.

FIG. 9 illustrates a method 900 for a memory write operation performed on SRAM 600, according to some embodiments. The operations shown in method 900 can be performed by, for example, write assist circuit 110 of FIG. 6. Other operations in method 900 can be performed. Further, the operations of method 900 can be performed in a different order and/or vary.

At operation 910, memory address information associated with the memory write operation for one or more memory cells in an array of memory cells is received. In some embodiments, the memory address information can include row location of an SRAM cell subject to the memory write operation. In referring to FIG. 6, column decoder 640 can receive the memory address information and FBL enable signal 612.

At operation 920, a reference voltage is provided to a first set of bitlines coupled to a first set of memory cells in the SRAM array and a second set of bitlines coupled to a second set of memory cells in the SRAM array. In some embodiments, the reference voltage can be provided by pull-down transistor 380 (shown at FIG. 3) that can initialize the reference voltage to the ground level prior to coupling the reference voltage to a negative voltage (as discussed below in operations 930 and 940).

At operation 930, the reference voltage is coupled with a boost circuit to a first negative voltage provided to the first and the second sets of bitlines, based on the memory address information. For example, in referring to FIGS. 4 and 6, when NBL enable signal 116 transitions from '0' to '1' (e.g., from logic low to logic high), reference voltage 118 can be coupled to the first negative voltage (e.g., reference voltage 118 without adjustment circuit 120, shown in FIG. 4). In some embodiments, the reference voltage can be coupled to the first negative voltage after the pull-down device is deactivated.

At operation 940, the reference voltage is coupled, with an adjustment circuit, to a second negative voltage higher than the first negative voltage, where the second negative voltage can be provided to the second set of bitlines based on the memory address information and FBL enable signal 612. For example, in referring to FIG. 5, reference voltage 118 can be pulled up, with adjustment circuit 520, to the second negative voltage by biasing transistors 522's gate terminal with the ground level or logic low, biasing transistors 522's source terminals with the ground level or positive voltage supplies, and pulling up, based on selection signal 525, the first negative voltage by transistors 522's drain terminals to generate the second negative voltage to provide the reference voltage. Therefore, reference voltage 118 can be pulled up from the first negative voltage by the second negative voltage and can be further coupled to BL/BLB or FBL/FBLB based on the memory address information and FBL enable signal 612. In some embodiments, the reference voltage can be substantially equal to the second negative voltage. In some embodiments, the reference voltage can be between the first negative voltage and the second negative voltage. In some embodiments, the reference voltage can be determined based on the memory address information. In some embodiments, operations 930 and 940 can be performed concurrently.

In some embodiments, operation 940 can further include coupling the reference voltage to a third negative voltage, where the third negative voltage can be provided to the first set of bitlines. The third negative voltage can be higher than the first negative voltage, and can be different from the second negative voltage. For example, reference voltage 118 can be coupled to the third negative voltage based on adjustment circuit 520's selection signal 525. The third negative voltage can be coupled to the first set bitlines based on the memory address information and FBL enable signal 612.

Embodiments of the present disclosure include a write assist circuit with a boost circuit and an adjustment circuit. The boost circuit can provide a first negative voltage for the NBL scheme. The adjustment circuit can receive the first negative voltage from the boost circuit, adjust the first negative voltage to a second negative voltage higher than the first negative voltage, and output the second negative voltage to bitlines and/or complementary bitlines of a SRAM. The adjustment circuit can include one or more transistors configured to provide the second negative voltage at their drain terminals. In some embodiments, each of the one or more transistors can have substantially equal threshold voltages to pass gate transistors of SRAM cells in the SRAM. In some embodiments, each of the one or more transistor's gate terminals can be biased with the ground level or logic low. As a result, each of the one or more transistors can have substantially equal ($V_{GS}$-$V_t$) as pass gate transistors of the SRAM cells in the SRAM. In some embodiments, each of the one or more transistor's source terminals can be biased with the ground level or a positive voltage supply. Therefore, when the first negative voltage provided by the boost circuit generates an undesired ($V_{GS}$-$V_t$) for unselected SRAM cells' pass gate transistors, such first negative voltage can be increased to the second negative voltage by the adjustment circuit. A benefit of the embodiments of the present disclosure is to utilize transistors that can be cost-effectively and concurrently fabricated with SRAM cells' pass gate transistors to reconcile the dummy write issue of the SRAM, thus avoiding operation errors of the IC.

In some embodiments, a write assist circuit can include a boost circuit configured to output a first negative voltage at a first output terminal, and an adjustment circuit configured to couple the first negative voltage to a second negative voltage higher than the first negative voltage. The adjustment circuit can include a transistor, and a second output terminal electrically connected to the first output terminal. The transistor can include a first source/drain terminal, a second source/drain terminal, and a gate terminal. The first source/drain terminal can be electrically coupled to the second output terminal. The second source/drain terminal can be electrically connected to a voltage source. The gate terminal can be electrically connected to a ground voltage supply.

In some embodiments, a memory device can include an array of memory cells, a writer driver circuit configured to provide a reference voltage, and a write assist circuit configured to couple the reference voltage from the write driver circuit to a first negative voltage. The write assist circuit can include a boost circuit configured to provide a second negative voltage lower than the first negative voltage, and an adjustment circuit configured to couple the second negative voltage to the first negative voltage. The adjustment circuit can include a transistor with a gate terminal, a first source/drain terminal, and a second source/drain terminal. The gate terminal can be electrically connected to a first voltage supply. The first source/drain terminal can be electrically connected to a second voltage supply. The second source/drain terminal can be electrically connected to the boost circuit and couples the second negative voltage to the first negative voltage.

In some embodiments, a method for a memory write operation can include receiving memory address information associated with the memory write operation for one or more memory cells, providing a reference voltage to one or more bitlines coupled to the one or more memory cells, coupling, with a boost circuit, the reference voltage to a first negative voltage, and coupling, with one or more pull-up transistors, the reference voltage to a second negative voltage higher than the first negative voltage based on the memory address information.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A write assist circuit, comprising:
a boost circuit configured to output a first negative voltage at an output terminal; and
an adjustment circuit configured to increase, at the output terminal, the first negative voltage to a second negative voltage higher than the first negative voltage.

2. The write assist circuit of claim 1, wherein the adjustment circuit comprises a transistor including a first source/drain terminal, a second source/drain terminal, and a gate terminal.

3. The write assist circuit of claim 2, wherein the first source/drain terminal is electrically connected to the output terminal, the second source/drain terminal is electrically connected to a voltage source, and a gate terminal is electrically connected to a ground voltage.

4. The write assist circuit of claim 3, wherein the voltage source is configured to provide the ground voltage.

5. The write assist circuit of claim 3, wherein the voltage source is configured to provide a positive voltage.

6. The write assist circuit of claim 2, wherein the adjustment circuit further comprises a multiplexer electrically connecting the first source/drain terminal to the output terminal.

7. The write assist circuit of claim 1, wherein the adjustment circuit further comprises a plurality of transistors, wherein gate terminals of the plurality transistors are electrically connected to a ground voltage and source/drain terminals of the plurality transistors are electrically connected to the output terminal.

8. A memory device, comprising:
an array of memory cells;
a write driver circuit electrically connected to a bitline of the array of memory cells;
a boost circuit comprising a pull-down transistor and configured to provide a negative voltage as a reference voltage to the write driver circuit after deactivating the pull-down transistor; and
an adjustment circuit comprising a pull-up transistor electrically connected to the bitline, wherein the adjustment circuit is configured to increase the reference voltage to the write driver circuit and to the bitline.

9. The memory device of claim 8, wherein each memory cell in the array of memory cells comprises a pass gate transistor, and wherein a threshold voltage of the pass gate transistor is substantially equal to a threshold voltage of the pull-up transistor.

10. The memory device of claim 8, wherein the pull-up transistor comprises a gate terminal electrically connected to a ground voltage source.

11. The memory device of claim 8, wherein the write driver circuit is configured to couple the negative voltage to the bitline voltage.

12. The memory device of claim 8, wherein the pull-up transistor comprises:
a first source/drain terminal electrically connected to a voltage source configured to output a logic high level; and
a second source/drain terminal electrically connected to the bitline and configured to increase the reference voltage.

13. The memory device of claim 12, wherein the adjustment circuit further comprises a multiplexer configured to electrically couple the second source/drain terminal to the bitline.

14. The memory device of claim 12, wherein the adjustment circuit further comprises an additional transistor, wherein the additional transistor comprises an additional gate terminal, an additional first source/drain terminal, and an additional second source/drain terminal, and wherein:
the additional gate terminal is electrically connected to ground;
the additional first source/drain terminal is electrically connected to the voltage source; and
the additional second source/drain terminal is electrically connected to the second source/drain terminal of the pull-up transistor.

15. The memory device of claim 12, wherein the adjustment circuit further comprises an additional transistor, wherein:
the additional transistor comprises an additional gate terminal, an additional first source/drain terminal, and an additional second source/drain terminal;
the additional gate terminal is electrically connected to ground;
the additional first source/drain terminal is electrically connected to the voltage source; and
the additional second source/drain terminal is electrically connected to the bitline.

16. The memory device of claim 15, wherein the adjustment circuit further comprises a multiplexer electrically connected to the second source/drain terminal of the pull-up transistor and to the additional second source/drain terminal of the additional transistor.

17. A method, comprising:
receiving memory address information for a memory cell associated with a memory write operation;
providing a reference voltage from an output terminal to a bitline coupled to the memory cell;

coupling the reference voltage at the bitline to a first negative voltage provided based on the memory address information; and increasing, by one or more pull-up transistors directly coupled to the output terminal, the reference voltage at the bitline to a second negative voltage higher than the first negative voltage.

18. The method of claim 17, wherein the providing the reference voltage comprises:

initializing the reference voltage to a ground level prior to coupling the reference voltage at the bitline to the first negative voltage; and increasing the first negative voltage to the second negative voltage.

19. The method of claim 17, wherein the increasing the reference voltage at the bitline to the second negative voltage comprises biasing a gate terminal of the one or more pull-up transistors for the memory cell to a logic low level.

20. The method of claim 17, wherein the increasing the reference voltage at the bitline to the second negative voltage comprises:

biasing, via a voltage source, a source terminal of each of the one or more pull-up transistors for the memory cell; and coupling, with a multiplexer, a drain terminal of each of the one or more pull-up transistors to the bitline.

* * * * *